June 13, 1972 M. A. FAIGENBAUM ET AL 3,669,665
PROCESS FOR MAKING RESIST STENCILS FROM PHOTOGRAPHIC
STRIPPING FILMS AND FOR USING SAME
Filed Feb. 18, 1971

INVENTORS
MARK A. FAIGENBAUM
DANIEL J. LASKY
HAROLD C. WEISEL

BY Robert Lieber
ATTORNEY 3,669,665

PROCESS FOR MAKING RESIST STENCILS FROM PHOTOGRAPHIC STRIPPING FILMS AND FOR USING SAME

Mark A. Faigenbaum, Poughkeepsie, Daniel J. Lasky, Wappingers Falls, and Harold C. Weisel, Pawling, N.Y., assignors to International Business Machines Corporation, Armonk, N.Y.

Filed Feb. 18, 1971, Ser. No. 116,317
Int. Cl. G03c *5/00*
U.S. Cl. 96—36 10 Claims

ABSTRACT OF THE DISCLOSURE

The separable layers of a photographic stripping film, consisting of a composite of a layer of sensitive unexposed emulsion (e.g. silver halide) carried upon a permanent support layer (e.g. cellulose nitrate) and stripped from the temporary support layer and smoothly adhered to an object surface with the permanent support layer adjacent the surface. The emulsion layer successively receives image-wise exposure to light in a fast exposure process, photographic development and relief development; the last by an etch-bleach process. The underlying support layer is dissolved image-wise with high-fidelity through the relief stencil in the emulsion layer. Exposed areas of the object surface then receive aqueous based process handling (e.g. etching or plating) through the aqueous resistant composite master stencil formed by the emulsion and support layers.

BACKGROUND OF THE INVENTION

(1) Field of the invention

Figure 1:
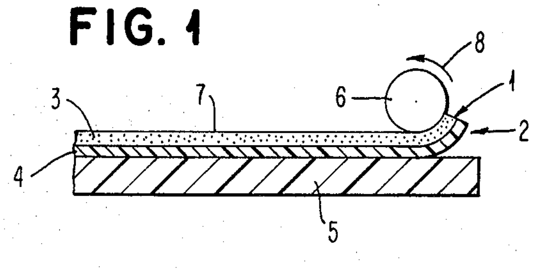

This invention pertains generally to methods of handling stripping films and especially to processes for making patterned photoresists from stripping films for use in close tolerance artwork transfer processes.

(2) Description of the prior art

Various photographic techniques are known for making patterned resists out of photographic stripping film, wherein the surface bearing the resist can be etched, plated or otherwise treated in an image pattern. Such stripping films are in some applications preferred over conventional polymer resists because of their higher sensitivity (shorter exposure periods). In one known method stripping film is successively exposed, developed in relief, stripped from a temporary support, transferred emulsion side down and adhered under pressure to a surface to be treated. Thereafter the organically soluble permanent support layer adjacent to and covering the emulsion is removed by an organic solvent. Then the emulsion is processed to resist stencil final form. Some of the difficulties with this method, in respect to tight tolerance artwork usage, are that the developed image in the emulsion is subject to deformation or distortion in the transfer-adhesion process and also in the subsequent removal processing of the permanent support layer and stencil processing of the emulsion. Furthermore it is difficult to obtain tight and uniform adhesion between the emulsion and the object surface to which it is attached without risk of deforming the emulsion.

The transfer distortion problem has been considered by others and eliminated to some extent by stripping and transferring the film unexposed with the emulsion face down. This may be followed successively by exposure of the emulsion through the overlying permanent support layer, dissolution of said support layer and relief processing of the remaining emulsion layer into a stencil suitable for resist usage. This however is also unsatisfactory for close tolerance artwork inasmuch as the exposure through the permanent support layer may add a factor of optical distortion and also inasmuch as uniform adhesion of the emulsion layer without distortion is still difficult to achieve.

The problems inherent in these prior techniques can be eliminated by the presently disclosed method which constitutes our inventive discovery. We strip and transfer/adhere the sensitive portion of unexposed stripping film, with the permanent support side interfacing with the receiving surface. Then successively we photo-expose the emulsion layer image-wise, without intervening distortional membranes, we process the emulsion layer by a process concluding with etch-bleach aqueous development into an undistorted first resist stencil, and we rapidly and controllably etch the permanent support sublayer in an organic solvent into an accurate second stencil identical to the first. The support sublayer which is resistant to aqueous media thus becomes an undistorted master quality stencil resist useful for further close tolerance aqueous treatment (e.g. etching or plating) of the receiving surface to which it has been adhered; irrespective of the final condition of the less resistant emulsion layer.

The invention is further illustrated but is not intended to be limited by the following specific example described with reference to the accompanying drawing wherein FIGS. 1–9, indicate successive stages of handling in subject process.

EXAMPLE

Under non-actinic conditions unexposed photographic stripping film (Kodak Ortho Type III Transparent Stripping Film) is stripped from a temporary support layer and adhered to a copper surface which is to be etched into a printed circuit pattern. The film is transferred with its permanent suport layer (cellulose nitrate) face down adjacent the copper surface and its photosensitive (emulsion) layer facing up. Subsequently the emulsion layer is photo-exposed image-wise and processed into a first relief stencil which is resistant to organic solvents. The organically soluble support sublayer is then processed through this first stencil in an organic solvent to form a second relief stencil faithfully identical to the first which is resistant to attack by aqueous media. After this the underlying copper surface is etched by a conventional aqueous etchant into the relief image shape defined by the second stencil and the stencil layers are removed. Details of this process and a discussion of its advantages follow.

Figure 2:
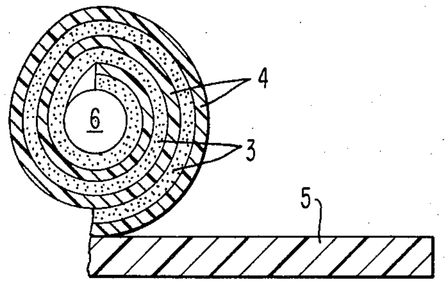

Stripping (FIGS. 1, 2)

Under non-actinic conditions (red safelight) stripping film which has been soaked for approximately three minutes in distilled water at 68° F±5° is stripped as follows. An edge 1 of the two-layer composite 2 consisting of the high resolution emulsion layer 3, and the permanent (cellulose nitrate) support membrance 4 is carefully separated from the polyethylene terephthalate temporary support layer 5 and attached along its entire length to a clean hard rubber roller 6 of at least equal length, with the emulsion side 7 adjacent the roller surface. The film 2 is then curled up on the roller, thereby stripping it from the temporary support layer 5, by rolling the roller smoothly in direction 8 across the entire film surface. The rolled up film is seen in FIG. 2. This technique eliminates wrinkling, stretching or tangling of the film as normally experienced in more conventional forms of handling of thin wet films. The film is also properly oriented (emulsion in/permanent support out) for transferral to the copper surface which is to be etched.

Figure 3:
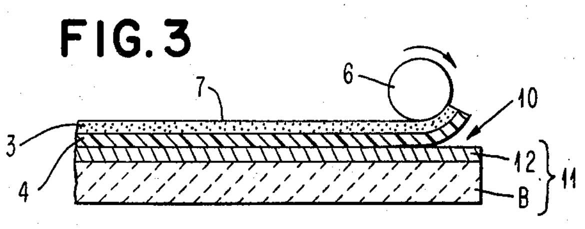

Adhesion to the copper (FIG. 3)

A thoroughly cleaned surface 10 of a part 11 consisting of a laminate of copper foil 12 and an etch-resistant base material B (e.g. glass or phenolic), is covered with a thin (not shown) coating of organic material which is a solvent for the cellulose nitrate permanent support membrane part 4 of the rolled up stripped film composite; preferably a 50:50 mixture of acetone/n-butyl alcohol. The mixture is spread over the surface 10 and the part 11 is elevated to allow excess mixture to drain off.

Under non-actinic conditions the rolled up film is smoothly unrolled upon the solvent wetted copper surface support side down. Support 4 thereby attaches to copper 12 by solvent bonding. The unexposed sensitive emulsion layer 3 is thereby isolated from deformational effects to which it would be subject in bonding; effects such as swelling, surface hardening, leaching of sensitizers, desensitization, bleaching or film stress.

The film which is now strongly adherent to the copper is smoother by re-rolling the rubber roller 6 over the surface 7 in order to eliminate air bubbles potentially entrapped at the bonding interface. This entire operation is preferably performed in a suitably clean environment to avoid entrapment of dust or dirt between the copper and support membrane.

Figure 4:
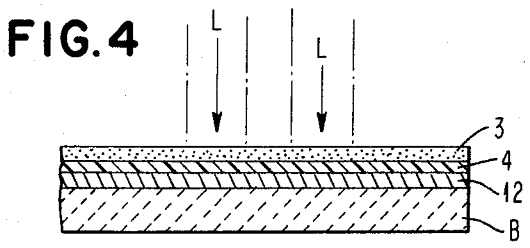

Photographic exposure (FIG. 4)

The bonded part is dried under non-actinic conditions to eliminate (evaporate) residual solvent. Drying is accomplished either in room temperature air for four hours or in a warm (not exceeding 95° F.) forced air oven for one-half hour. The emulsion layer is now actinically photo-exposed to light L supplied by not shown artwork tracing equipment normally used with type III Ortho materials (e.g. Gerber Artwork Generator apparatus). This creates a master quality pre-developed latent image of the artwork in the emulsion.

Figure 5:
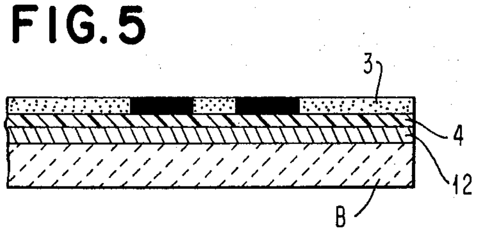
Figure 6:
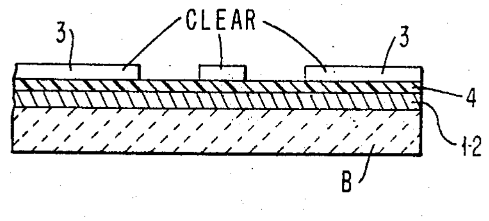

Emulsion layer processing (FIGS. 5, 6)

After such exposure, the part is subjected to normal photographic processing develop, fix, wash), then dried and carefully inspected for adherence to pattern tolerances and image fidelity. The state of the processed part at this point is indicated schematically in the sectional view of FIG. 5. Inspection may be bypassed for many process applications, and if it is the drying step may also be eliminated. Next, the part is immersed for four minutes in Kodak EB–2 solution at 68° F., with gentle agitation. This solution is prepared as follows:

Combine Solutions A and B in equal parts.

Solution A:
- Copper sulfate—8 oz.
- Citric acid—10 oz.
- Potassium bromide—½ oz.
- Water to make—64 oz.

Solution B:
- 3% hydrogen peroxide.

This etch-bleach process removes the silver parts of the image from the surrounding transparent gelatin as indicated in FIG. 6 creating a gelatin relief stencil over the permanent support sublayer, in the image pattern transferred by the actinic photo-exposure.

Figure 7:
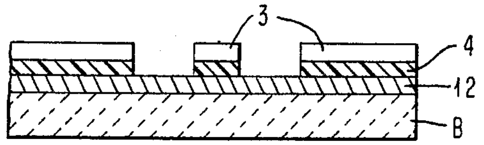

Etching of the support sublayer (FIG. 7)

The solvent bonded cellulose nitrate sublayer is now solvent-etched in the gelatin stencil pattern by the following procedure. The part is bathed with gentle agitation in a 50:50 (volume percent) acetone/n-butyl alcohol bath (at 68° F.±5° F.) for approximately one minute. This procedure dissolves and removes the cellulose nitrate in a stencil image pattern as indicated in FIG. 7, this pattern conforming precisely to the exposure image defined by the gelatin stencil. It is noted that the gelatin stencil acts as a resist to the organic solvent, thereby preserving image fidelity. Microscopic inspection reveals minimal undercutting of the cellulose nitrate membrane layer. The above organic solvent can also be applied by spraying with equivalent results.

Figure 8:
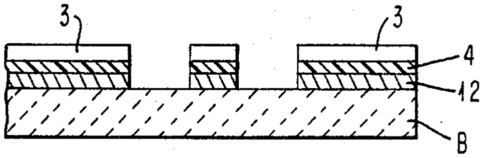

Etching of the copper (FIG. 8)

The copper 12 may now be pattern etched by conventional spray or immersion techniques in an aqueous based etchant such as ammonium persulfate, cupric chloride or ferric chloride. The patterned cellulose nitrate support, which is resistant to attack by aqueous media, now serves as a master resist stencil in this phase of the process. The etched part is indicated schematically in FIG. 8.

Figure 9:
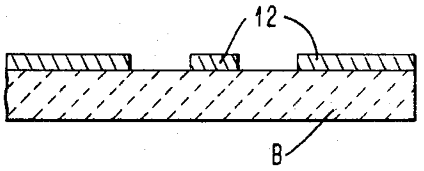

Removal of the resist (FIG. 9)

After etching the composite resist (gelatin and cellulose nitrate stencils) is removed by successive immersions in dilute sodium hypochlorite (to dissolve the gelatin) and acetone (to dissolve the remaining cellulose nitrate).

The foregoing procedure is easily modified for plating upon the copper, instead of etching it, by simply substituting a step of treatment in aqueous plating media for the above copper etching step.

In summary the foregoing method provides "high speed" resist stencil construction for high quality close tolerance artwork etching or plating processes, or the like. The increase in exposure speed over standard polymer photoresists is especially suited to the application of high speed dynamic artwork generation techniques and equipment (e.g. Gerber apparatus as mentioned above), whereby master images can be projected directly upon the resist without intervening contact masks or other devices subject to distortion.

We have shown and described above the fundamental novel features of the invention as applied to a preferred embodiment. It will be understood that various omissions, substitutions and changes in form and detail of the invention as described herein may be made by those skilled in the art without departing from the true spirit and scope of the invention. It is the intention therefore to be limited only by the scope of the following claims.

What is claimed is:

1. Process for constructing resist masks suitable for aqueous based handling of substrate media comprising:

under non-actinic conditions, attaching a stripped portion of unexposed stripping film, which consists of a composite of a layer of aqueously developable photosensitive emulsion carried upon a thin permanent support layer of organically soluble material, to an object surface to be resist masked; with the emulsion side out and the support side is adjacent the surface;

exposing said out facing emulsion side to actinic radiation to create therein a pre-developed (latent) image pattern;

processing said emulsion side in aqueous media to produce therein a first stencil having an image pattern corresponding to said latent image pattern;

processing said permanent support layer in organic solvent media to create a second stencil having an image pattern therein identical in outline to said first stencil image pattern.

2. In a process according to claim 1 the additional step, preceding said attaching step, of stripping said film portion from a temporary support, under non-actinic conditions; accomplished by immersing the composite of said portion and temporary support in distilled water at room temperature for approximately three minutes, separating an edge of said film portion from said temporary support, adhering said edge emulsion side in permanent support side out to a hard rubber roller member and curling up said film portion upon said member by rolling said member across the entire emulsion face.

3. A process according to claim 1 wherein said step of attaching said film portion to said object surface includes the steps of uniformly wetting said object surface with an organic solvent bonding mixture and depositing said film portion upon said wetted surface, with the said permanent support adjacent the surface, whereby said permanent support is solvent bonded to said surface.

4. The process of claim 2 wherein said attaching step includes the steps of wetting the entire surface of said object with an organic solvent, depositing said rolled up film from said rubber member upon said wetted surface with said permanent support adjacent to said surface, by rolling the same over said surface to create a solvent bond between said permanent support and said surface; and re-rolling said rubber member over the emulsion face of said film portion to eliminate air bubbles from the solvent bond interface.

5. A process according to claim 1 in which the step of processing said emulsion in aqueous media includes successive steps of developing, fixing, washing, and etch-bleaching the said emulsion.

6. The process of claim 1 in which the said step of processing said permanent support layer is accomplished by applying thereto through said first stencil formed in said emulsion layer an organic solvent for a period of time sufficient to fully dissolve the image parts of said permanent support layer defined by said first stencil.

7. In combination with a process according to claim 1 the additional steps subsequent to the processing of said permanent support layer of processing the image parts of said object surface defined by said first and second stencils in an aqueous medium.

8. The process of claim 7 wherein the said processing of said object surface parts consists of the application thereto of an aqueous etchant.

9. The process of claim 7 wherein the said processing of said object surface parts consists of the deposition thereupon of additional material in an aqueous plating system.

10. The process of claim 7 combined with the additional final step of removging said first and second stencils formed in said respective emulsion and permanent support layers by successive application thereto of respective aqueous and organic solvents serving respectively to attack the remnants of the emulsion and support stencils.

References Cited

UNITED STATES PATENTS

| | | | |
|---|---|---|---|
| 2,094,025 | 9/1937 | Scantlebury | 96—36 UX |
| 2,120,441 | 6/1938 | Leiber | 96—35 |
| 2,638,417 | 5/1953 | White et al. | 96—36 X |
| 2,726,200 | 12/1955 | Holsapple | 96—36 UX |
| 2,892,711 | 6/1959 | Sanford et al. | 96—37 X |
| 3,310,403 | 3/1967 | Bryan | 96—35 X |
| 3,447,960 | 6/1969 | Tonozzi | 96—36.2 X |
| 3,526,504 | 9/1970 | Celeste | 96—36.2 X |

DAVID KLEIN, Primary Examiner

U.S. Cl. X.R.

96—36.2, 36.3, 37, 35